US011469765B1

(12) United States Patent
Brady et al.

(10) Patent No.: US 11,469,765 B1
(45) Date of Patent: Oct. 11, 2022

(54) MULTI-CHANNEL HIGH-SPEED CONVERTER CLOCK SYNCHRONIZATION WITH AUTONOMOUS COHERENT DETERMINISTIC LATENCY

(71) Applicant: National Technology & Engineering Solutions of Sandia, LLC, Albuquerque, NM (US)

(72) Inventors: Charles E. Brady, Albuquerque, NM (US); Hung Loui, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/469,023

(22) Filed: Sep. 8, 2021

(51) Int. Cl.
| | |
|---|---|
| *H03L 7/18* | (2006.01) |
| *H03L 7/189* | (2006.01) |
| *H03L 7/083* | (2006.01) |
| *H03L 7/099* | (2006.01) |
| *H03L 7/24* | (2006.01) |

(52) U.S. Cl.
CPC .............. *H03L 7/189* (2013.01); *H03L 7/083* (2013.01); *H03L 7/0992* (2013.01); *H03L 7/24* (2013.01)

(58) Field of Classification Search
CPC ...... H03L 7/00; H03L 7/06; H03L 7/07; H03L 7/18; H03L 7/187; H03L 7/189; H03L 7/193; H03L 7/24; H03L 7/0992
USPC ...................................................... 307/11–16
See application file for complete search history.

(56) References Cited

U.S. PATENT DOCUMENTS

| | | | |
|---|---|---|---|
| 7,902,886 B2 * | 3/2011 | Pfaff ....................... H03L 7/183 | |
| | | | 327/147 |
| 9,559,703 B2 * | 1/2017 | Cenger .................... H03L 7/08 |
| 10,340,931 B1 * | 7/2019 | Cheren ............... H03M 1/0624 |

* cited by examiner

*Primary Examiner* — Hai L Nguyen
(74) *Attorney, Agent, or Firm* — Mark A. Dodd

(57) ABSTRACT

A system and corresponding method that achieves coherency and deterministic latency (CDL) autonomously upon power on is disclosed. The system, for example, a multi-channel RF system, may require CDL with respect to the digital-to-analog converters (DACs) and analog-to-digital converters (ADCs) assigned to the channels in the system. CDL is achieved through a timed combination of external reference and synchronization signals, resetting and disabling of various clock dividers, and enabling clock generation. In addition to synchronizing all of the clocks, the data acquisition sequence must be synchronized across all of the channels, whether they are on chips, cards, or chassis. Data acquisition synchronization may be implemented using an initiator/target or a wired OR mode configuration.

19 Claims, 8 Drawing Sheets

MULTI-CHANNEL HIGH-SPEED CONVERTER CLOCK SYNCHRONIZATION WITH AUTONOMOUS COHERENT DETERMINISTIC LATENCY

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a method of clock synchronization with autonomous coherent deterministic latency of multi-channel high-speed converters (ADCs/DACs) for radar and other radio frequency (RF) applications requiring methods of the same.

BACKGROUND

Many radio frequency (RF) systems require multiple channels, with each channel having its own digital-to-analog converter (DAC) and analog-to-digital converter (ADC). For these RF systems to work properly, the channels, including their corresponding DAC and ADC clocks, must be synchronized. This synchronization includes two aspects.

The first synchronization aspect relates to coherence. A definition for coherence with respect to clocks is that the clocks must have a known phase relationship over time. Thus, the fact that two clocks operate at the same frequency is not sufficient, they must have a known phase relationship. For example, two clocks are characterized by the equations:

$$C_1(t) = \sin(\omega_0 t + \varphi_1(t)) \quad \text{and Eq. 1A}$$

$$C_2(t) = \sin(\omega_0 t + \varphi_2(t)). \quad \text{Eq. 1B}$$

For the two clocks to be perfectly coherent, $\varphi_2(t) - \varphi_1(t)$ must ideally be constant over time, i.e., $\varphi_2(t) - \varphi_1(t) \approx \varphi$. If the two clocks are derived from the same reference source with similar phase noise profiles and are always on, maintaining coherency may readily be achieved. Coherency is a requirement for the second synchronization aspect, which is deterministic latency.

A definition for deterministic latency with respect to clocks is that the phase relationship between the two clocks must be the same each time the clocks are powered on, i.e., undergo a power on reset (POR). For example, two coherent clocks are characterized by the equations:

$$C_1(t-\tau_1^i) = \sin(\omega_0(t-\tau_1^i) + \varphi_1(t)) \text{ and} \quad \text{Eq. 2A}$$

$$C_2(t-\tau_2^i) = \sin(\omega_0(t-\tau_2^i) + \varphi_2(t)), \quad \text{Eq. 2B}$$

with $\tau_1^i$ and $\tau_2^i$ corresponding to the clock delays for the $i^{th}$ POR sequence. For the two clocks to have deterministic latency, $\tau_2^i - \tau_1^i$ must ideally be a constant for all i or all POR sequences.

While current multi-channel RF systems with high-speed converters can achieve coherency, they do not achieve it with deterministic latency. Typical multi-channel RF systems must be reset over and over or a special calibration procedure must be performed to achieve the required level of coherency and deterministic latency (CDL), especially in multi-channel RF systems where each channel, and its corresponding high-speed converters, is controlled by a different chip, a different card, or a different chassis. This creates a problem when an RF system is expected to operate correctly upon power on. Thus, a need exists for an RF system with multiple channels and corresponding high-speed converters, that achieves CDL autonomously upon power on, regardless of whether the channels are handled by different chips, cards, or chassis.

SUMMARY

One aspect of the present invention relates to a system that achieves coherency and deterministic latency (CDL) autonomously upon power on. The system may, for example, be a multi-channel RF system that requires CDL with respect to the digital-to-analog converters (DACs) and analog-to-digital converters (ADCs) assigned to the channels in the system. CDL is achieved through a timed combination of external reference and synchronization signals, resetting and disabling the various clock dividers, and enabling clock generation. In addition to synchronizing all of the clocks, the data acquisition sequence must be synchronized across all of the channels, whether they are on chips, cards, or installed in a different chassis. Data acquisition synchronization may be implemented using an initiator/target or a wired OR mode configuration.

In at least one embodiment of the present invention, a method for autonomously achieving coherency and deterministic latency in a multi-channel system comprises the steps of providing a multi-channel system (the multi-channel system including a plurality of processing boards, each of the processing boards including a processor (the processor including a controller for issuing commands and a system reference generator for generating a synchronization/system reference signal), a synchronizer for receiving an external synchronization clock signal, an acquisition trigger for generating a converter master trigger signal, a board-to-board trigger port for transmitting or receiving a board-to-board trigger signal, and a tristate buffer for controlling when the board-to-board trigger port transmits or receives the board-to-board trigger signal, a phase lock loop (PLL) for receiving the synchronization/system reference signal (the PLL including a voltage-controlled oscillator (VCO) for outputting a VCO clock signal, a VCO feedback divider for dividing down the VCO clock signal by a first factor, a local system clock divider for dividing down the VCO clock signal by a second factor, thereby generating a local system clock signal, and one or more clock dividers, each of the one or more clock dividers for dividing down the VCO clock signal by a corresponding factor, thereby generating one or more corresponding divided clock signals, wherein the VCO, the VCO feedback adapter, the local system clock divider, and the one or more clock dividers form a local system clock tree), and at least one of a digital-to-analog converter (DAC) or an analog-to-digital converter (ADC) (the least one of a DAC or an ADC for receiving the converter master trigger signal and initiating conversion)), initializing each PLL via a corresponding command issued by a corresponding controller, supplying an external reference clock signal to each VCO, supplying the external synchronization clock signal to each synchronizer (the external synchronization clock signal coherent with the external reference clock signal), resetting each VCO feedback divider and each local system clock divider via a corresponding command issued by a corresponding controller (thereby causing each VCO clock signal and each local system clock signal to be coherent with the external reference clock signal), disabling resetting of each VCO feedback divider and each local system clock divider via a corresponding command issued by a corresponding controller, sending and releasing a corresponding synchronization command issued by a corresponding controller to a corresponding system reference clock generator and a corresponding PLL (thereby causing each synchronization/system reference signal, each local system clock signal, and the corresponding one or more divided clock signals to be coherent with the external reference clock signal), disabling resetting of each local system clock divider and the corresponding one or more clock dividers via a corresponding command issued by a corresponding controller, enabling generation of each synchronization/system reference signal by a corresponding system reference generator via a corresponding command issued by a corresponding controller, generating each converter master trigger signal, and initiating conversion by a corresponding at least one of a DAC or an ADC.

In various embodiments, each processing board further includes a corresponding local oscillator for receiving the external reference clock signal and the method further comprises the steps of supplying the external reference clock signal to each local oscillator (each local oscillator thereby generating a corresponding local oscillator clock signal) and supplying a corresponding local oscillator clock signal to a corresponding at least one of a DAC or an ADC; each processing board further includes a jitter cleaner for suppressing high frequency phase noise in the external reference clock signal and the method further comprises the steps of suppressing high frequency phase noise in the external reference clock signal using a corresponding jitter cleaner and supplying a corresponding suppressed high frequency phase noise local oscillator clock signal to a corresponding at least one of a DAC or an ADC; the method further comprises the steps of externally deriving a high-speed sample clock signal from the external reference clock signal and supplying the high-speed sample clock signal to the at least one of a DAC or an ADC; the step of initializing the PLL includes one or more of readying the PLL to be synchronized to the external reference clock signal, resetting the PLL, setting up one or more clock paths, selecting one or more output types, or enabling one or more outputs; and the method further comprises the steps of designating a first processing board of the plurality of processing boards as an initiating processing board, designating a remainder of the plurality of processing boards as target processing boards, each of the target processing boards tristating their corresponding tristate buffers (each of the target processing boards thereby receiving the board-to-board trigger signal), each controller issuing a corresponding local trigger command to a corresponding synchronizer (the controller of the initiator processing board issuing the local trigger command after the corresponding controllers of the target processing boards issue corresponding local trigger commands), each synchronizer registering a corresponding local trigger command to a corresponding local system clock signal, each acquisition trigger registering a corresponding registered local trigger command to the external synchronization clock signal, the initiator processing board driving the board-to-board trigger signal to a corresponding board-to-board trigger port of the target processing boards, capturing the board-to-board trigger signal at a corresponding board-to-board trigger port, each acquisition trigger registering the board-to-board trigger signal to the external synchronization clock signal (each processing board thereby synchronizes a corresponding local system clock tree with each other local system clock tree and the external reference clock signal).

In various other embodiments, the method further comprises the steps of each controller driving a corresponding board-to-board trigger port low via a corresponding tristate buffer, each controller issuing a corresponding local trigger command to a corresponding synchronizer, each synchronizer registering a corresponding local trigger command to a corresponding local system clock signal, each acquisition trigger registering a corresponding registered local trigger command to the external synchronization clock signal, each controller issuing a command to turn off a corresponding tristate buffer (when a last tristate buffer is turned off a board-to-board trigger signal transitions high), capturing the board-to-board trigger signal at a corresponding board-to-board trigger port, each acquisition trigger registering the captured board-to-board trigger signal to the external synchronization clock signal (each processing board thereby synchronizes a corresponding local system clock tree with each other local system clock tree and the external reference clock signal); the external reference clock signal and the external synchronization clock signal are the same clock signal; a frequency of the external synchronization clock signal is a greatest common divisor of all clock signal frequencies generated by the local system clock tree; and after the step of disabling resetting of each VCO feedback divider, the method further includes the step of enabling resetting each of the one or more clock dividers via a corresponding command issued by a corresponding controller.

In at least one embodiment of the present invention, a multi-channel system comprises a plurality of processing boards, each of the processing boards including a processor (the processor including a controller for issuing commands based on instructions and a system reference generator for generating a synchronization/system reference signal), a synchronizer for receiving an external synchronization clock signal, an acquisition trigger for generating a converter master trigger signal, a board-to-board trigger port for transmitting or receiving a board-to-board trigger signal, a tristate buffer for controlling when the board-to-board trigger port transmits or receives the board-to-board trigger signal, and a phase lock loop (PLL) for receiving the synchronization/system reference signal (the PLL including a voltage-controlled oscillator (VCO) for receiving an external reference clock signal (the external reference clock signal coherent with the external synchronization clock signal, the VCO for outputting a VCO clock signal), a VCO feedback divider for dividing down the VCO clock signal by a first factor, a local system clock divider for dividing down the VCO clock signal by a second factor (thereby generating a local system clock signal), and one or more clock dividers (each of the one or more clock dividers for dividing down the VCO clock signal by a corresponding factor, thereby generating one or more corresponding divided clock signals), the VCO, the VCO feedback adapter, the local system clock divider, and the one or more clock dividers forming a local system clock tree), and at least one of a digital-to-analog converter (DAC) or an analog-to-digital converter (ADC), the least one of a DAC or an ADC for receiving the converter master trigger signal and initiating conversion, the processor further including a memory for storing instructions, the instructions causing the controller to issue commands including an initialization command to the PLL, a reset command to the VCO feedback divider and the local system clock divider (thereby causing the VCO clock signal and the local system clock signal to be coherent with the external reference clock signal), a disable reset command to the VCO feedback divider and the local system clock divider, a synchronization command to the system reference clock generator and the PLL (thereby causing the synchronization/system reference signal, the local system clock signal, and the one or more divided clock signals to be coherent with the external reference clock signal), a disable reset command to the local system clock divider and the one or more clock dividers, and an enable generation command to the system reference generator to generate the synchronization/system reference signal (the acquisition trigger thereby generating the master trigger signal).

In various embodiments, the synchronizer includes at least first and second flipflops and the acquisition trigger includes at least third and fourth flipflops; the multi-channel system further comprises a clock source for generating the external reference clock signal and the external synchronization clock signal; each processing board further includes a corresponding local oscillator for receiving the external reference clock signal (each local oscillator thereby generating a corresponding local oscillator clock signal), and each of the at least one of a DAC or an ADC for receiving a corresponding local oscillator clock signal; each processing board further includes a jitter cleaner for suppressing high frequency phase noise in the external reference clock signal, and each of the at least one of a DAC or an ADC for receiving a corresponding suppressed high frequency phase noise local oscillator clock signal; and the multi-channel system further comprising a high-speed sample clock for receiving the external reference clock signal (the high-speed sample clock for generating one or more high-speed sample clock signals therefrom), and each of the at least one of a DAC or an ADC for receiving one of the one or more high-speed sample clock signals.

In various other embodiments, the memory stores further instructions causing the controller to issue commands including a determination command to determine if a corresponding processing board is designated as an initiating processing board or a target processing board, when the processing board is designated as a target processing board, a tristating command to a corresponding tristate buffer (the target processing board thereby receiving the board-to-board trigger signal), a local trigger generator command to a corresponding synchronizer (the corresponding synchronizer generating a corresponding local trigger command, the controller of the initiator processing board issuing the local trigger command after the corresponding controllers of the target processing boards issue corresponding local trigger commands, each synchronizer for registering a corresponding local trigger command to a corresponding local system clock signal, each acquisition trigger registering a corresponding registered local trigger command to the external synchronization clock signal), when the processing board is designated as an initiator processing board, a board-to-board trigger command to the board-to-board trigger port (the initiator processing board thereby transmitting the board-to-board trigger signal to the board-to-board trigger ports of the target processing boards, each processing board thereby capturing the board-to-board trigger signal at a corresponding board-to-board trigger port, each acquisition trigger registering the board-to-board trigger signal to the external synchronization clock signal, each processing board thereby synchronizing a corresponding local system clock tree with each other local system clock tree and the external reference clock signal); the memory stores further instructions causing the controller to issue commands including a board-to-board trigger low command to a corresponding tristate buffer (each processing board thereby driving a corresponding board-to-board trigger port low), a local trigger generator command to a corresponding synchronizer (the corresponding synchronizer generating a corresponding local trigger command, each synchronizer for registering a corresponding local trigger command to a corresponding local system clock signal, each acquisition trigger registering a corresponding registered local trigger command to the external synchronization clock signal), a tristate off command to a corresponding tristate buffer (wherein when a last tristate buffer is turned off a board-to-board trigger signal transitions high, each processing board thereby capturing the board-to-board trigger signal at a corresponding board-to-board trigger port, each acquisition trigger registering the board-to-board trigger signal to the external synchronization clock signal, each processing board thereby synchronizing a corresponding local system clock tree with each other local system clock tree and the external reference clock signal); and wherein a frequency of the external synchronization clock signal is a greatest common divisor of all clock signal frequencies generated by the local system clock tree.

In at least one embodiment of the present invention, a multi-channel system comprises at least one processing board, each of the at least one processing board includes at least one of a digital-to-analog converter (DAC) or an analog-to-digital converter (ADC); at least one phase lock loop (PLL) (each of the at least one PLL includes a phase detector (PD) for receiving an external reference clock signal and a feedback signal, the phase detector for outputting a phase signal, a voltage-controlled oscillator (VCO) for receiving the phase signal, the VCO for outputting a high-speed VCO clock signal, a first divider for dividing down the high-speed VCO clock signal by a first factor (thereby generating a first low-speed internal clock signal, the first divider for outputting the first low-speed internal clock signal, the PD for receiving the first low-speed internal clock signal as the feedback signal), a second divider for dividing down the high-speed VCO clock signal by a second factor (thereby generating a second low-speed internal clock signal, the second divider for outputting the second low-speed internal clock signal, the second divider for receiving a reset command), and a flipflop for receiving a synchronization command and the first low-speed internal clock signal (the flipflop for registering the synchronization command with the first low-speed internal clock signal, the flipflop for outputting the registered synchronization command, the second divider for receiving the registered synchronization command as the reset command to thereby deterministically reset the second divider)), and a processor for receiving an external synchronization clock signal (the external synchronization clock signal being coherent with the external reference clock signal, the processor for outputting the synchronization command to the flipflop, the processor for receiving the second low-speed internal clock signal, the processor for controlling operation of the at least one of the DAC or ADC based upon the second low-speed internal clock signal).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
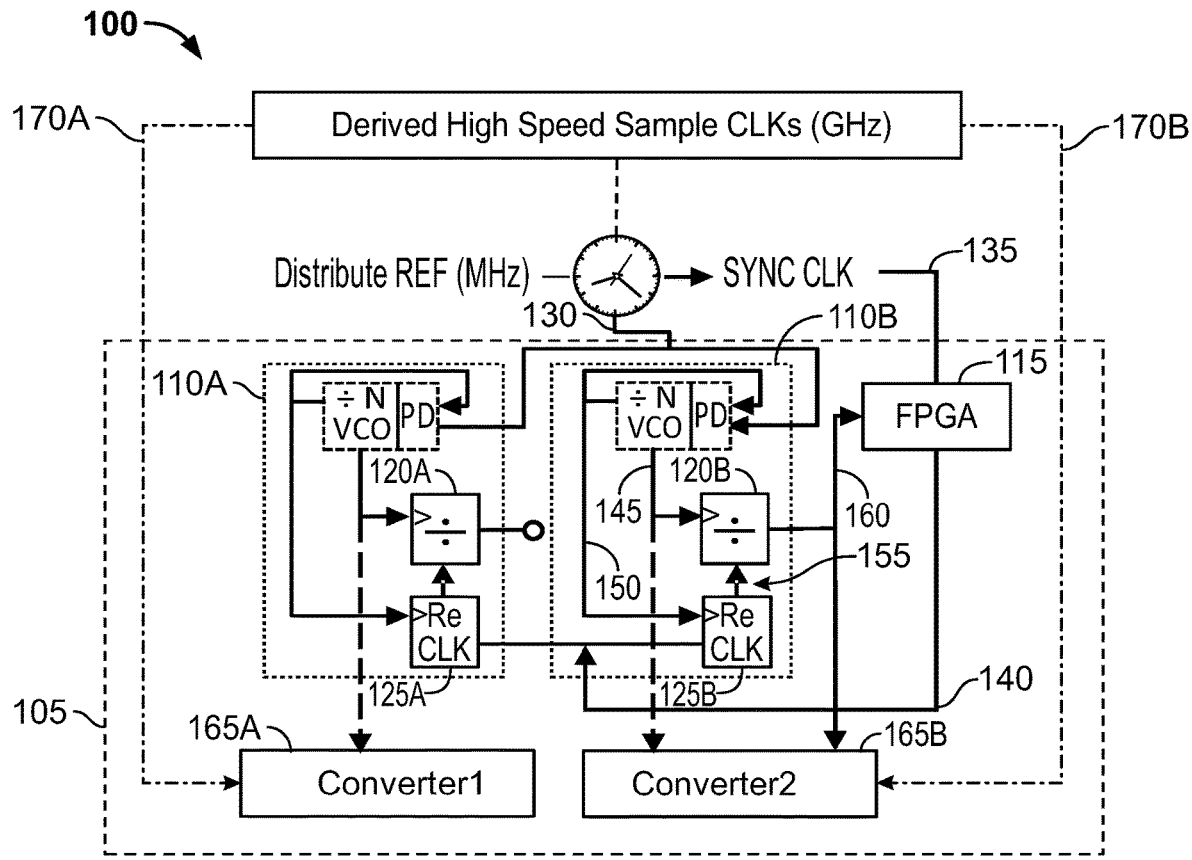
FIG. 1 illustrates a high-level portion of a multi-channel RF system in accordance with one or more embodiments of the present invention.

FIG. 1 illustrates, at the highest level, a portion of a multi-channel system 100 in accordance with an embodiment of the present invention to provide an overview thereof. The multi-channel system 100 achieves coherency and deterministic latency (CDL) autonomously upon power on. The multi-channel system 100 includes a signal processing board 105 with a pair of phase lock loops (PLL) 110A, 110B, and a processor in the form of a field programmable gate array (FPGA) 115. Each of the PLLs 110A, 110B includes a respective phase detector (PD), a respective voltage-controlled oscillator (VCO), a respective first divider (labeled ÷N), a respective second divider 120A, 120B, and a respective flipflop 125A, 125B. The first divider (labeled ÷N) and the second divider 120A, 120B each divides down a higher speed clock signal by a corresponding factor to create a corresponding lower speed clock signal. An external reference clock signal 130 drives the PLLs 110A, 110B. An external synchronization clock signal 135, which is coherent with the external reference clock signal 130, is provided to the FPGA 115. The FPGA 115 outputs an internal synchronization command 140 to the flipflops 125A, 125B. The voltage-controlled oscillator of the second PLL 110B outputs a high-speed VCO clock signal 145 to the second divider 120B. The first PLL 110A outputs a corresponding high-speed VCO clock signal to the second divider 120A.

The first divider of the PLL 110B outputs a low-speed clock signal 150 to flipflop 125B, with the flipflop 125B registering, or re-clocking, the external synchronization command 140 from the FPGA 115. The first divider of the PLL 110A outputs a corresponding low-speed clock signal to flipflop 125A, with the flipflop 125A registering the external synchronization command 140 from the FPGA 115. The internal synchronization signal 155 is fed to the divider 120B, which deterministically resets the divider 120B. A corresponding internal synchronization signal is fed to the divider 120A, which deterministically resets the divider 120A. With the divider 120B having been deterministically reset, the divider output clock signal 160 is fed to the FPGA 115, which then uses the divider output clock signal 160 to feed the communications links to a pair of converters 165A, 165B.

The pair of converters 165A, 165B may, for example, be digital-to-analog converters (DACs) and/or analog-to-digital converters (ADCs). The pair of converters 165A, 165B may be driven by corresponding externally derived high-speed sample clock signals 170A, 170B in a manner that is referred to as "direct clocking." Alternatively, the pair of converters 165A, 165B may be driven by the high-speed VCO clock signal 145 in a manner that is referred to as "on-board clocking." Because the pair of converters 165A, 165B may be driven in either of two manners, this increases the versatility of this CDL circuit topology.

Figure 2:
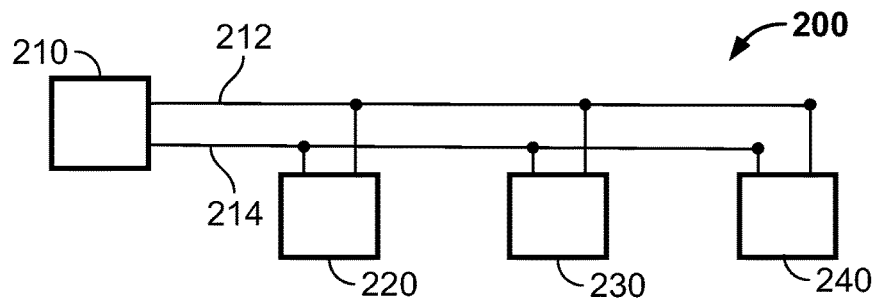
FIG. 2 illustrates a portion of a multi-channel RF system in accordance with one or more embodiments of the present invention.

FIG. 2 illustrates a portion of a multi-channel system 200 having a clock source 210 that generates an external reference clock signal 212 and an external synchronization clock signal 214. The external reference clock signal 212 and the external synchronization clock signal 214 correspond to the reference clk and sync clk signals, respectively, in FIGS. 8A and 8B. The external reference clock signal 212 and the external synchronization clock signal 214 are fed to signal processing boards 220, 230, 240. Each of the signal processing boards 220, 230, 240 has at least one corresponding DAC and/or at least one corresponding ADC.

Figure 3:
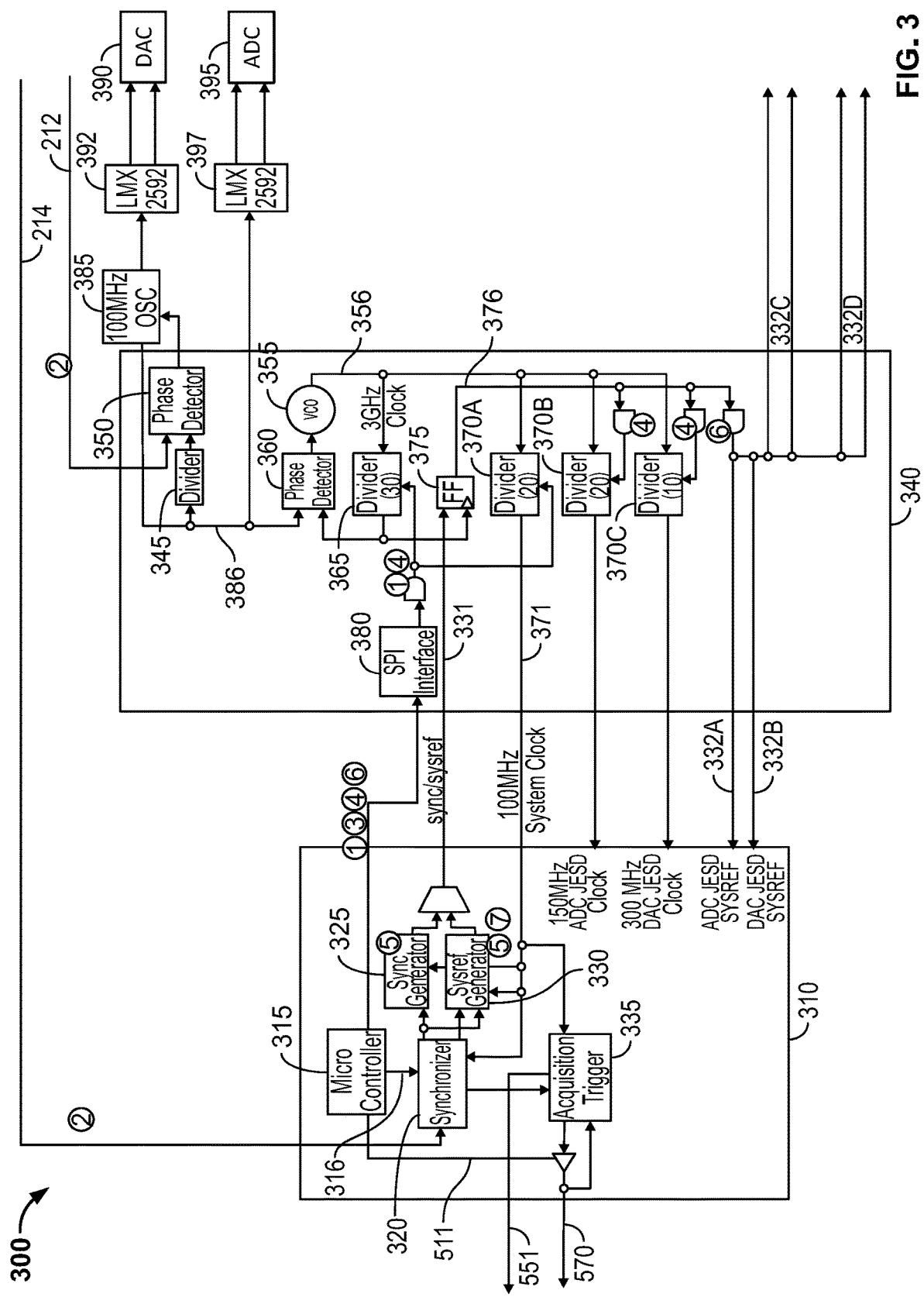
FIG. 3 illustrates a processing board for a multi-channel RF system in accordance with one or more embodiments of the present invention.

FIG. 3 illustrates an example of one of the processing boards 220, 230, 240 in greater detail, in which the processing board 300 employs on-board clocking. The processing board 300 includes a processor in the form of an FPGA 310, a PLL 340, a local oscillator 385, a high-speed DAC 390 with clocking from a first frequency synthesizer 392, and a high-speed ADC 395 with clocking from a second frequency synthesizer 397. The FPGA 310 includes a controller in the form of a microcontroller 315, a synchronizer 320, a sync generator 325, a sysref generator 330, and an acquisition trigger 335. Though not illustrated, the FPGA 310 includes a memory for storing instructions that are executed by the microcontroller 315. Execution of these stored instructions by the microcontroller 315 implements the various steps and methods described below. The PLL 340 includes a "jitter cleaner" (comprising a first divider 345, a corresponding first phase detector 350, and the local oscillator 385), a VCO 355 and a corresponding second phase detector 360, a VCO feedback divider 365, a series of additional clock dividers 370A-370C, a flip-flop 375, and a serial peripheral interface (SPI) 380 coupled to the microcontroller 315. The first divider 345, the VCO feedback divider 365, and the additional clock dividers 370A-370C each divides down a higher speed clock signal by a corresponding divisor to create a corresponding lower speed clock signal. While FIG. 3 illustrates a single high-speed DAC 390 and a single high-speed ADC 395, each processing board may have multiple high-speed DACs and/or multiple high-speed ADCs.

To better understand the invention, the following describes the synchronization method implemented by at least one embodiment. Based upon the described synchronization method, one may more readily understand the system that implements the corresponding at least one embodiment.

Figure 4:
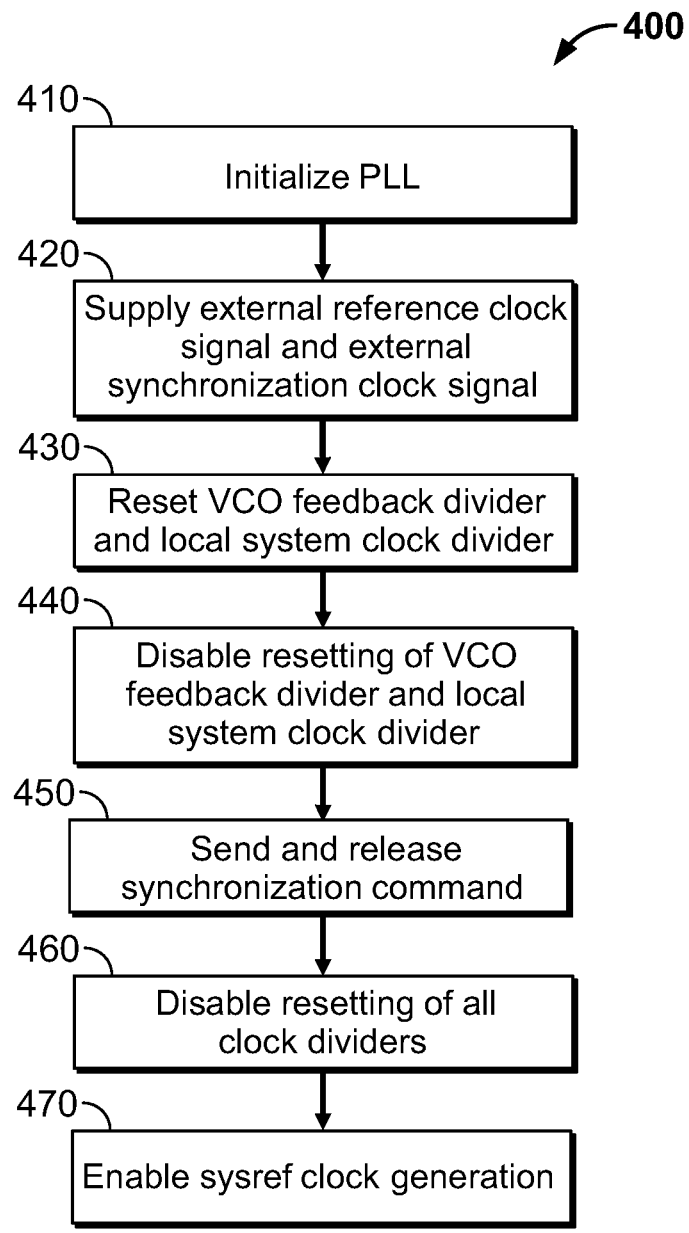
FIG. 4 illustrates a flowchart for a synchronization method in accordance with one or more embodiments of the present invention.

The synchronization method 400 is illustrated as a flowchart in FIG. 4. The flowchart outlines the steps to initialize the local system clock tree and coherently align it to the external reference clock 212. In step 410, the PLL 340 is initialized by commands from the microcontroller 315 via the SPI 380. Initializing the PLL 340 may include, among other things, readying the PLL 340 to be synchronized to the external reference clock signal 212 and establishing a deterministic phase relationship between the external reference clock signal 212 and the internal VCO 355. This initializing may also include, for example, resetting the PLL 340, setting up various clock paths, selecting output types, and enabling various outputs. Elements involved with step 410 are identified by a "1" in FIG. 3.

In step 420, the coherent external reference clock signal 212 is applied to the jitter cleaner, i.e., the first divider 345, the first phase detector 350, and the local oscillator 385 to reduce the jitter magnitude of the external reference clock 212 prior to supplying the reduced jitter reference clock 386 to the VCO 355. In addition, the external synchronization clock signal 214 is supplied to the synchronizer 320 within the FPGA 310. The external synchronization clock signal 214 provides the timing reference to the FPGA 310 to determine the clock phase alignment boundary. The frequency of the external reference clock signal 212 and the external synchronization clock signal 214 are arbitrary so long as both are coherent. In some embodiments, the external reference clock signal 212 and the external synchronization clock signal 214 are the same clock signal, being generated by a single clock source 210. In other embodiments, the external reference clock signal 212 and the external synchronization clock signal 214 are different clock signals, though both may be generated by a single clock source 210. The frequency of the external synchronization clock signal 214 should be the greatest common divisor of all the generated clocks in the multi-channel system 200. Elements involved with step 420 are identified by a "2" in FIG. 3.

In step 430, the microcontroller 315 sends commands via the SPI 380 to reset the VCO feedback divider 365 and the local system clock divider 370A that generates the local system clock signal 371. The local system clock signal 371 corresponds to the clk_100 MHz signal in FIGS. 8A and 8B. Both the VCO feedback divider 365 and the local system clock divider 370A begin dividing on the same cycle of a high-speed VCO clock signal 356 generated by the VCO 355. The high-speed VCO clock signal 356 corresponds to the clk_3 GHz signal in FIGS. 8A and 8B. Because the VCO feedback divider 365 is in the feedback path of the VCO 355, both the local system clock signal 371 and the high-speed VCO clock signal 356 will be coherent with each other and with the external reference clock signal 212. The local system clock signal 371 is used as the timing and control clock signal for the processing board 300. Elements involved with step 430 are identified by a "3" in FIG. 3.

In this embodiment, the local oscillator 385 is stabilized using the external reference clock signal 212 through use of the jitter cleaner, i.e., the first divider 345, the first phase detector 350, and the local oscillator 385. The result is that the local oscillator 385 acquires the frequency accuracy of the external reference clock signal 212 while suppressing any high frequency phase noise that the external reference clock signal 212 may have. This corresponds to the on-board clocking approach. In other embodiments, the external reference clock signal 212 is directly coupled to the VCO 355, which corresponds to the direct clocking approach. Which of these two approaches is used may depend, for example, on the overall system requirements.

In step 440, the microcontroller 315 sends commands via the SPI 380 to disable resetting of both the VCO feedback divider 365 and the local system clock divider 370A. The microcontroller 315 also sends commands via the SPI 380 to enable resetting of the clock dividers 370B, 370C. Elements involved with step 440 are identified by a "4" in FIG. 3.

In step 450, a synchronization command signal 316 from the microcontroller 315 is sent to the synchronizer 320 for transitioning to the domain of the local system clock signal 371, where it is held until the next edge of the external synchronization clock signal 214. The synchronization command signal 316 corresponds to the lmk sync signal in FIGS. 8A and 8B. Following the rising edge of the external synchronization clock signal 214, the synchronizer 320 sends the synchronization command to both the sysref generator 330 and the PLL 340 to reset the clock dividers 370A-370C. Through use of the sync generator 325, the synchronization command is released on the next rising edge of the external synchronization clock signal 214, and thus the sysref generator 330 and the clock dividers 370A-370C start counting together and their corresponding clock rising edges, i.e., the sync/sysref signal 331, the local system clock signal 371, and the clock signals from the clock dividers 370B-370C, are coherent with the external reference clock signal 212.

Meeting the setup and hold timing requirements for the resets generated by the synchronization command is critical as the clock dividers 370A-370C may be running at GHz rates. The flip-flop 375 re-registers the synchronization command signal before applying it to the clock dividers 370A-370C in the PLL 340. This re-registered, i.e., reclocked, synchronization command signal 376 is identified as the reclocked_sync_sysref signal in FIGS. 8A and 8B. Since the clock to the flip-flop 375 is coherent with the GHz rate VCO clock signal 356 and the flip-flop 375 is tightly coupled with the clock dividers 370A-370C, setup and hold for the resets is maximized and thus should meet the reset requirements of the clock dividers 370A-370C. Elements involved with step 450 are identified by a "5" in FIG. 3.

In step 460, the microcontroller 315 sends commands via the SPI 380 to disable resetting of the additional clock dividers 370A-370C. The microcontroller 315 also sends a command to enable the sync/sysref signal 331 to drive the sysref output ports 332A-D from the PLL 340. The sync/sysref signal 331 corresponds to the sync sysrefl signal in FIGS. 8A and 8B. Elements involved with step 460 are identified by a "6" in FIG. 3.

In step 470, the microcontroller 315 sends a command to the sysref generator 330 to enable generation of the sync/sysref signal 331. The synchronizer 320 transitions this command to the domain of the local system clock signal 371 and then waits for the next edge of the external synchronization clock signal 214. When the synchronizer 320 detects the rising edge of the external synchronization clock signal 214, the synchronizer 320 releases the command to the sysref generator 330 to allow the sync/sysref signal 331 to be output to the PLL 340 for distribution to all devices on the processing board 300. All clocks on the processing board 300 are now coherent with the external reference clock signal 212 and the process is deterministic from one POR to the next POR. Elements involved with step 470 are identified by a "7" in FIG. 3.

Figure 5:
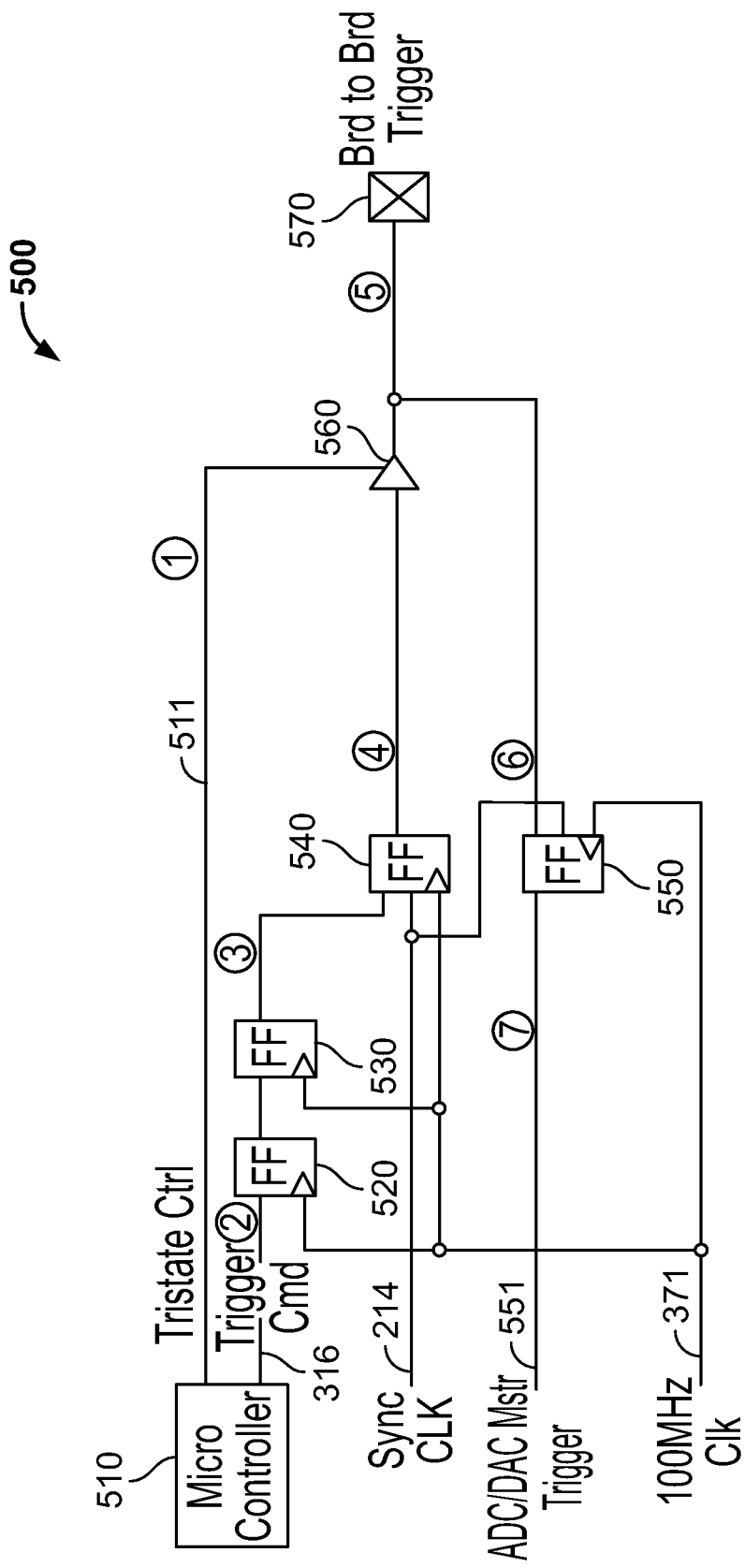
FIG. 5 illustrates a circuit used to implement a synchronization method in accordance with one or more embodiments of the present invention.
Figure 6:
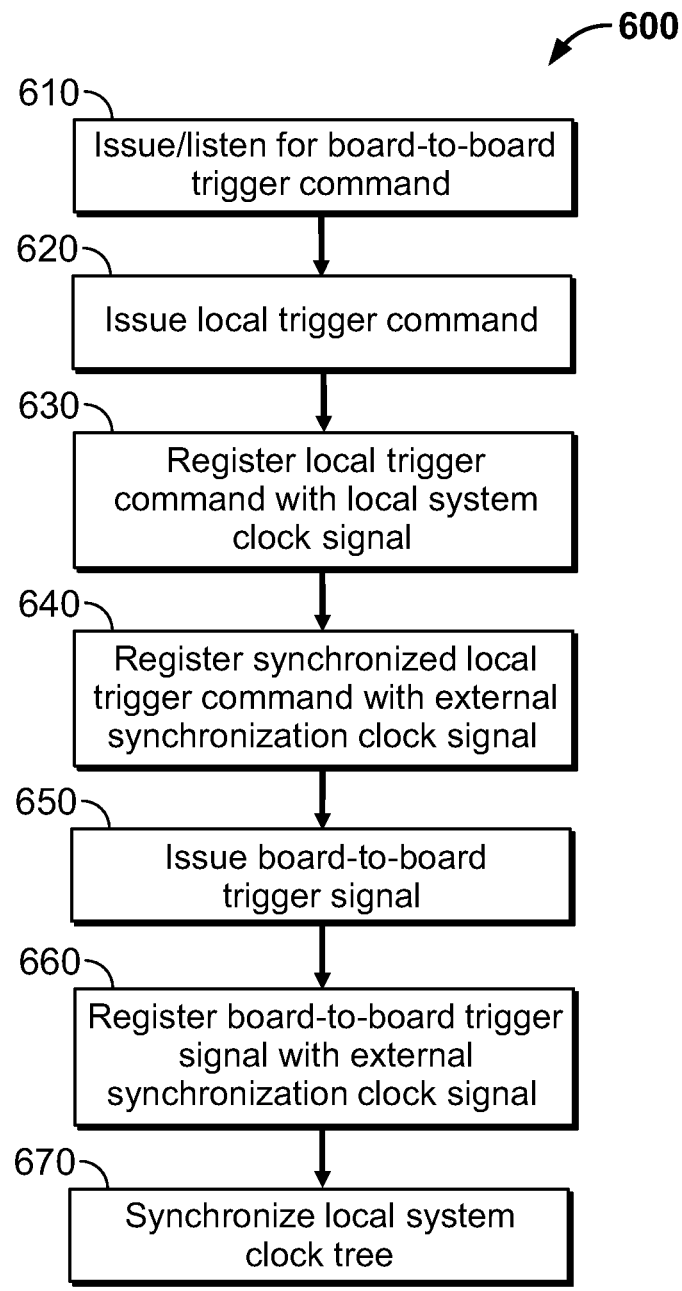
FIG. 6 illustrates a flowchart for an initiator/target implementation of a synchronization method in accordance with one or more embodiments of the present invention.
Figure 7:
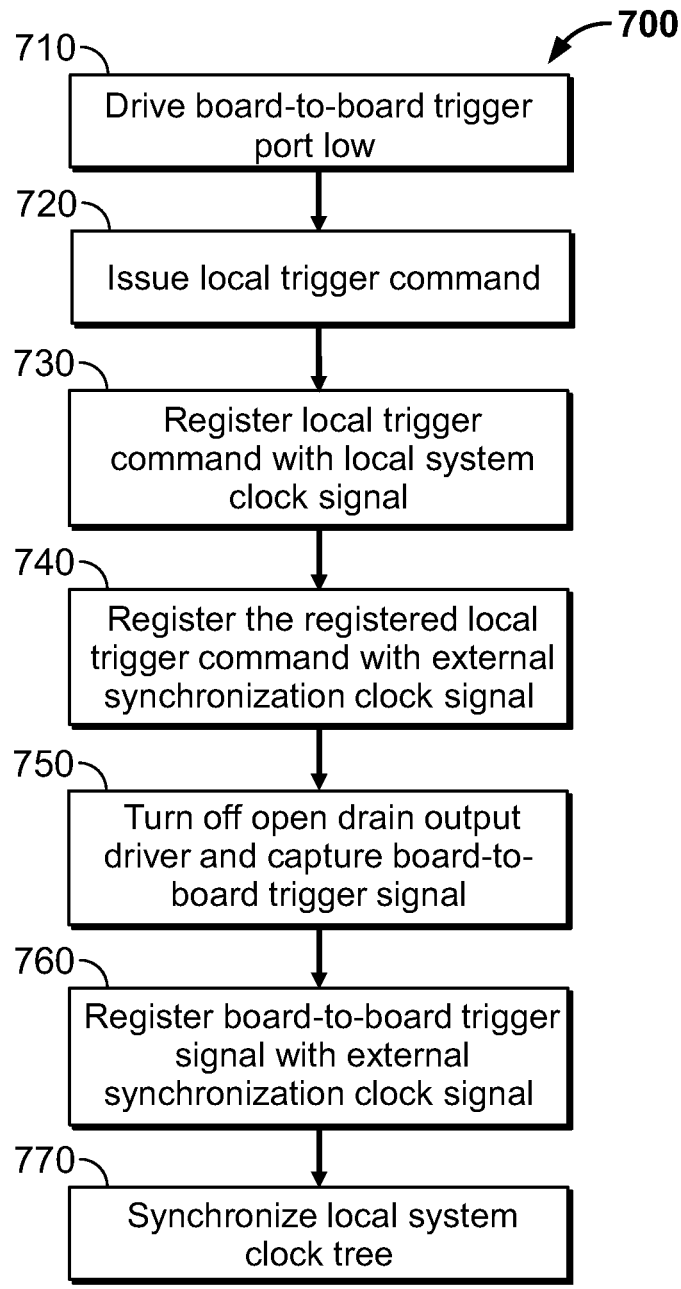
FIG. 7 illustrates a flowchart for a wired OR mode implementation of a synchronization method in accordance with one or more embodiments of the present invention.

The synchronization method 400 described above with reference to FIG. 4, which may be extended to synchronize multiple cards and multiple chassis of cards, can be implemented in at least two different ways using the circuit 500 illustrated in FIG. 5. FIGS. 6 and 7 illustrate, in flowchart form, an initiator/target implementation method 600 and a wired OR mode implementation method 700, respectively, using the circuit 500. The circuit 500 includes a microcontroller 510, first through fourth flipflops 520, 530, 540, 550, a tristate buffer 560, and a board-to-board trigger port 570. The microcontroller 510 corresponds to the microcontroller 315 described above with reference to FIG. 3. The first two flipflops 520, 530 correspond, at least in part, to the synchronizer 320 described above with reference to FIG. 3. The remaining flipflops 540, 550 correspond, at least in part, to the acquisition trigger 335 described above with reference to FIG. 3. The initiator/target implementation method 600 is better suited to synchronizing systems that include multiple chassis, as it drives the board-to-board trigger high and low and reduces the impact of loading on the propagation delay of the board-to-board signal compared to the wired OR mode. The wired OR mode implementation 700 is better suited to synchronizing systems within a single chassis and where defining a specific card to be the initiator limits the flexibility of the system.

The purpose of the acquisition trigger 335 and its corresponding flipflops 540, 550 is to align the start of DAC signal generation and ADC data sampling across multiple boards. The execution of code in the microcontroller 315/510 is not deterministic. For example, the execution sequence can be impacted by interrupts, how the microcontroller 315/510 is released from reset, etc. The logic of the acquisition trigger 335 and its corresponding flipflops 540, 550 provide a lock-step point in the initialization of the data acquisition that ensures that all processing boards in the system start both DAC signal generation and ADC data sampling coherently and deterministically.

The logic of the acquisition trigger 335 and its corresponding flipflops 540, 550 can also be used to control when steps 450, 460, 470 are executed in the case where all the clocks in the system do not phase align with every cycle of the external reference clock signal 212. In this case, the acquisition trigger 335 and its corresponding flipflops 540, 550 are used to ensure that all processing boards in the system synchronize the sysref generator 330 and the PLL dividers 370A-370C coherently. Thus, all clocks across all processing boards are coherent with the same rising edge of the external reference clock signal 212. This ensures CDL is maintained under this special case.

In the initiator/target implementation method 600, one processing board is configured to be the initiator, while the remaining processing boards are configured as targets. In step 610, the microcontroller 510 in all of the target processing boards tristate their respective board-to-board trigger ports 570 using their respective tristate buffers 560 via a tristate control signal 511. The tristate control signal 511 corresponds to the brdtobrd_sync_out signal in FIGS. 8A and 8B. This enables each of the target processing boards to listen to the initiator processing board. Conversely, in step 610, the initiator processing board does not tristate its tristate buffer 560 so that it can drive its board-to-board trigger port 570. Elements involved with step 610 are identified by a "1" in FIG. 5.

In step 620, when the system is ready to synchronize, the microcontroller 510 in all of the target processing boards issues a local trigger command to a respective first flipflop 520 and waits for a board-to-board trigger to be received. The initiator processing board is configured to delay board setup to ensure that the initiator processing board issues its trigger command to its flipflop 520 last. Elements involved with step 620 are identified by a "2" in FIG. 5.

In step 630, each processing board's local trigger command is registered to the local system clock signal 371 using a respective second flipflop 530. Elements involved with step 630 are identified by a "3" in FIG. 5.

In step 640, each processing board registers the registered local trigger command using a respective third flipflop 540 that is clock enabled using the external synchronization clock signal 214. This ensures that the trigger is released onto the board-to-board trigger port 570 at a known deterministic time. All processing boards then wait for receipt of a board-to-board trigger. Elements involved with step 640 are identified by a "4" in FIG. 5.

In step 650, the initiator processing board drives its board-to-board trigger signal to the board-to-board trigger port 570 of the target processing boards. Elements involved with step 650 are identified by a "5" in FIG. 5.

In step 660, all of the processing boards, including initiator and target processing boards, capture the board-to-board trigger signal at their respective board-to-board trigger ports 570 and register it using a respective fourth flip-flop 550, which is clock enabled using the external synchronization clock signal 214. Since the board-to-board trigger is output on a rising edge of the external synchronization clock signal 214 and clocked back into each target processing board on the next rising edge of the external synchronization clock signal 214, this allows the trigger to be transferred at a slower clock rate relative to the local system clock signal 371, for example, at 10 MHz or less, instead of 100 MHz. This slower clock rate ensures there is sufficient time to propagate the trigger to all of the target processing boards. Elements involved with step 660 are identified by a "6" in FIG. 5.

In step 670, the registered board-to-board trigger that is received by all of the processing boards on the same rising edge of the external synchronization clock signal 214 propagates forward together allowing each processing board to synchronize its local system clock tree with the external reference clock signal 212 and the local system clock tree on each of the other processing boards. This permits triggering of each processing board's high-speed DAC and high-speed ADC via a respective DAC/ADC initiator trigger signal 551 at the same time as all the other processing boards in the system.

The wired OR mode implementation method 700 illustrated in FIG. 7 advantageously does not require a designated initiator processing board. In step 710, each processing board is configured to drive its respective board-to-board trigger port 570 low via the tristate buffer 560. Elements involved with step 710 are identified by a "1" in FIG. 5.

In step 720, when the system is ready to synchronize, the microcontroller 510 in all of the processing boards issues a local trigger command to a respective first flipflop 520 and waits for a board-to-board trigger to be received. Elements involved with step 720 are identified by a "2" in FIG. 5.

In step 730, each processing board's local trigger command is registered to the local system clock signal 371 using a respective second flipflop 530. Elements involved with step 730 are identified by a "3" in FIG. 5.

In step 740, each processing board registers the registered local trigger command using a respective third flipflop 540 that is clock enabled using the external synchronization clock signal 214. This ensures that the trigger is released onto the board-to-board trigger port 570 at a known deterministic time. All processing boards then wait for receipt of a board-to-board trigger. Elements involved with step 740 are identified by a "4" in FIG. 5.

In step 750, each processing board's trigger output command causes the tristate buffer 560 to turn off so that the processing board no longer drives the board-to-board trigger port 570 low. When the last processing board turns off its tristate buffer 560, the board-to-board trigger signal transitions high allowing the board-to-board trigger signal to propagate forward and be captured by the acquisition trigger logic, i.e., the fourth flipflop 550, on each processing board. Elements involved with step 750 are identified by a "5" in FIG. 5.

In step 760, each of the processing boards captures the board-to-board trigger at a respective board-to-board trigger port 570 and registers it using a respective fourth flip-flop 550, which is clock enabled using the external synchronization clock signal 214. Since the board-to-board trigger is output on a rising edge of the external synchronization clock signal 214 and clocked back into each processing board on the next rising edge of the external synchronization clock signal 214, this allows the board-to-board trigger to be transferred at a slower clock rate relative to the local system clock signal 371, for example, at 10 MHz or less, instead of 100 MHz. This slower clock rate ensures there is sufficient time to propagate the board-to-board trigger to all of the processing boards. Elements involved with step 760 are identified by a "6" in FIG. 5.

In step 770, the registered board-to-board trigger that is received by all of the processing boards on the same rising edge of the external synchronization clock signal 214 propagates forward together allowing each processing board to synchronize its local system clock tree. This permits triggering of each processing board's high-speed DAC and high-speed ADC via a respective DAC/ADC initiator trigger signal 551 at the same time as all the other processing boards in the system.

Figure 8A:
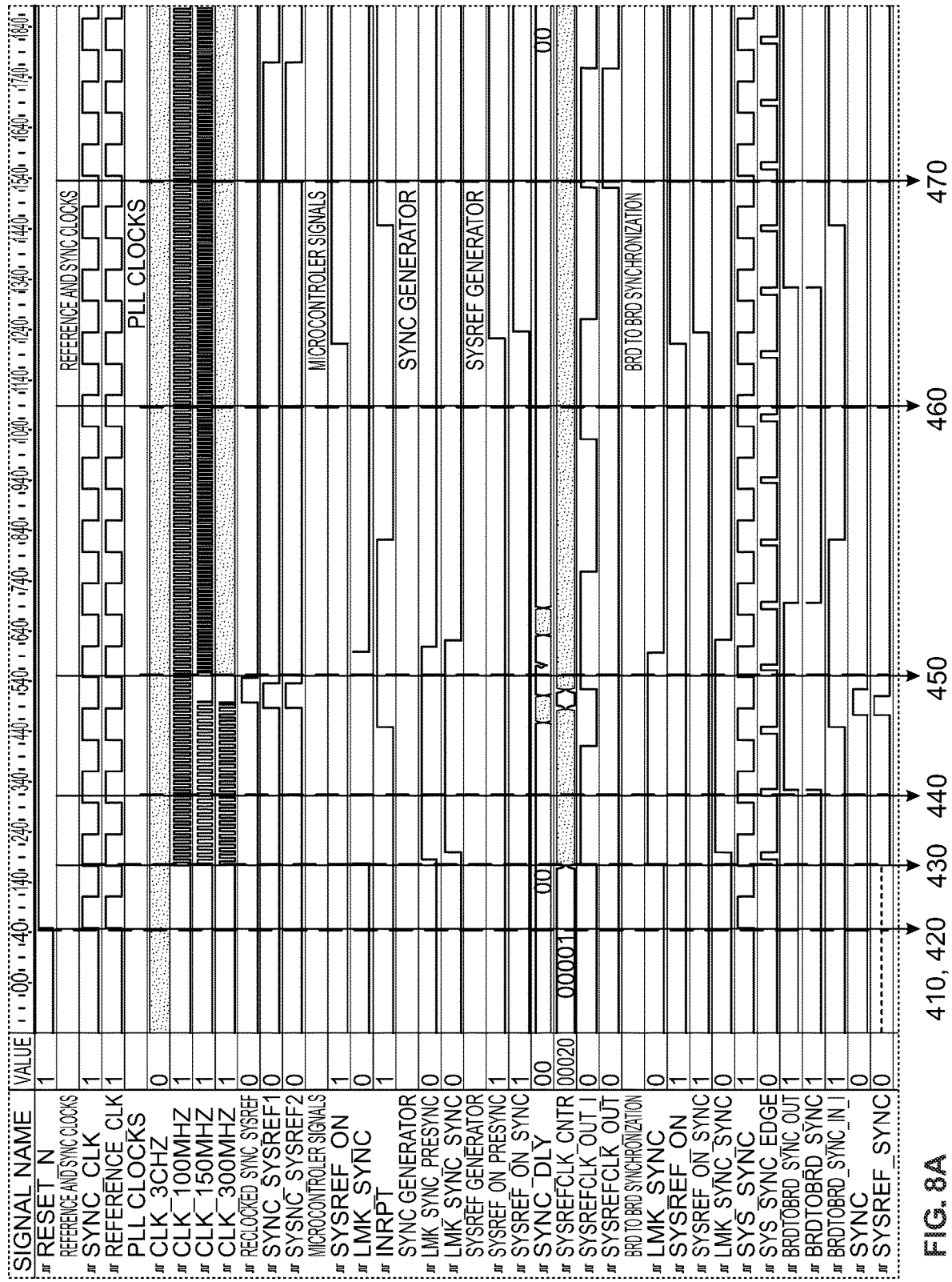
FIGS. 8A and 8B illustrate timing diagrams for one or more embodiments of the present invention.
Figure 8B:
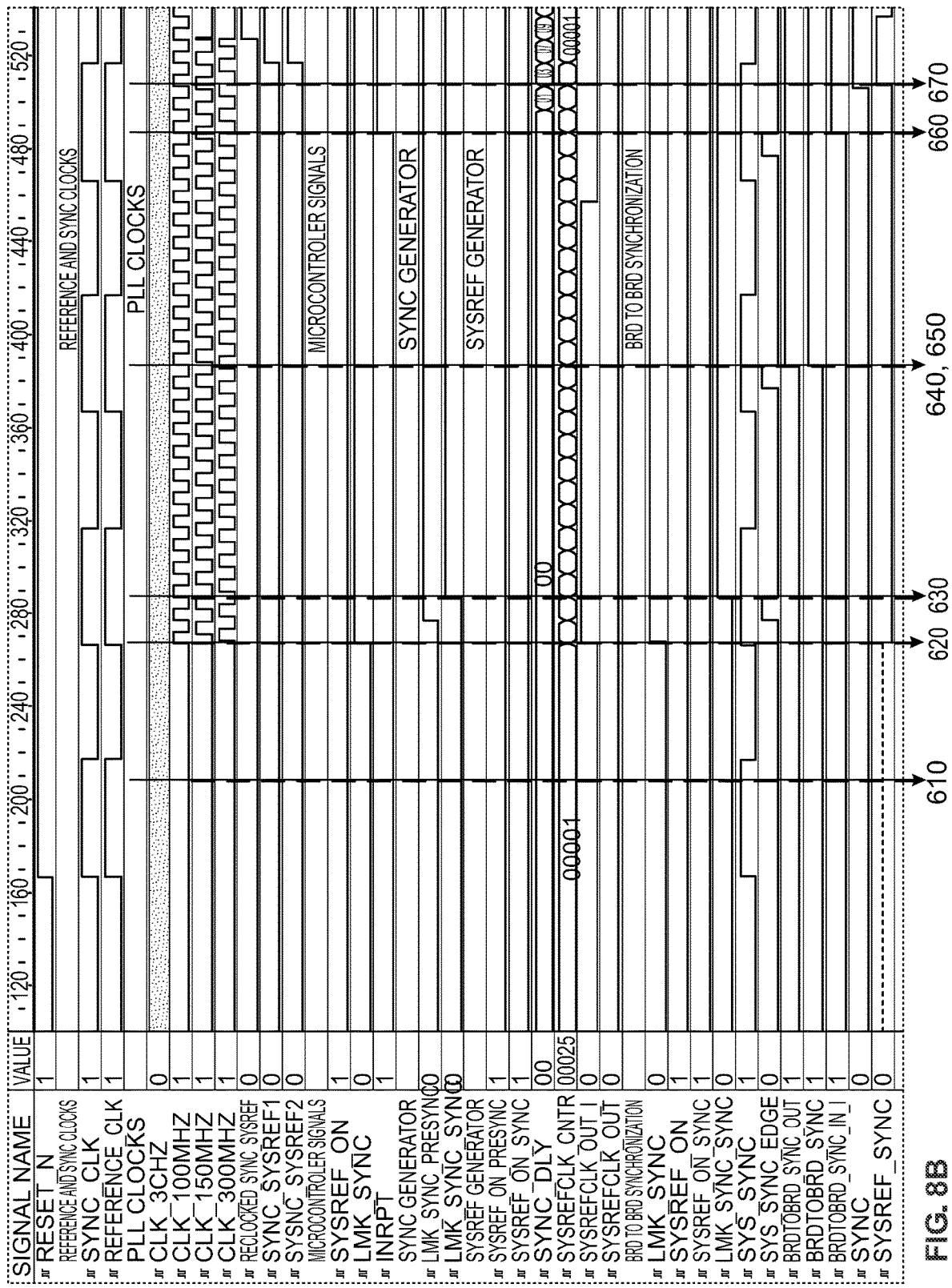

FIGS. 8A and 8B illustrate timing diagrams for the various signals and steps discussed above with reference to FIGS. 3-7. The various signals are identified on the left sides of FIGS. 8A and 8B. Timing events corresponding to the steps illustrated in FIG. 4 are labeled as 410, 420, 430, 440, 450, 460, and 470 in FIG. 8A. Timing events corresponding to the steps illustrated in FIG. 6 are labeled as 610, 620, 630, 640, 650, 660, and 670 in FIG. 8B. Note the timescale in FIG. 8B is expanded compared to FIG. 8A. Also note that several of the steps have a significant duration and the indicated timing events generally correspond to the completion of the corresponding step.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for autonomously achieving coherency and deterministic latency in a multi-channel system, the method comprising the steps of:
providing a multi-channel system, the multi-channel system including a plurality of processing boards, each of the processing boards including:
a processor including:
a controller adapted to issue commands;
a system reference generator adapted to generate a synchronization/system reference signal;
a synchronizer adapted to receive an external synchronization clock signal;
an acquisition trigger adapted to generate a converter master trigger signal;
a board-to-board trigger port adapted to transmit or receive a board-to-board trigger signal; and
a tristate buffer adapted to control when the board-to-board trigger port transmits or receives the board-to-board trigger signal;
a phase lock loop (PLL) adapted to receive the synchronization/system reference signal, the PLL including:
a voltage-controlled oscillator (VCO) adapted to output a VCO clock signal;
a VCO feedback divider adapted to divide down the VCO clock signal by a first factor;
a local system clock divider adapted to divide down the VCO clock signal by a second factor, thereby generating a local system clock signal; and
one or more clock dividers, each of the one or more clock dividers adapted to divide down the VCO clock signal by a corresponding factor, thereby generating one or more corresponding divided clock signals;
wherein the VCO, the VCO feedback adapter, the local system clock divider, and the one or more clock dividers form a local system clock tree; and
at least one of a digital-to-analog converter (DAC) or an analog-to-digital converter (ADC), the least one of a DAC or an ADC adapted to receive the converter master trigger signal and initiate conversion;
initializing each PLL via a corresponding command issued by a corresponding controller;
supplying an external reference clock signal to each VCO;
supplying the external synchronization clock signal to each synchronizer, the external synchronization clock signal coherent with the external reference clock signal;
resetting each VCO feedback divider and each local system clock divider via a corresponding command issued by a corresponding controller, thereby causing each VCO clock signal and each local system clock signal to be coherent with the external reference clock signal;
disabling resetting of each VCO feedback divider and each local system clock divider via a corresponding command issued by a corresponding controller;
sending and releasing a corresponding synchronization command issued by a corresponding controller to a corresponding system reference clock generator and a corresponding PLL, thereby causing each synchronization/system reference signal, each local system clock signal, and the corresponding one or more divided clock signals to be coherent with the external reference clock signal;
disabling resetting of each local system clock divider and the corresponding one or more clock dividers via a corresponding command issued by a corresponding controller;
enabling generation of each synchronization/system reference signal by a corresponding system reference generator via a corresponding command issued by a corresponding controller;
generating each converter master trigger signal; and
initiating conversion by a corresponding at least one of a DAC or an ADC.

2. The method of claim 1,
wherein each processing board further includes a corresponding local oscillator adapted to receive the external reference clock signal;
wherein the method further comprises the steps of:
supplying the external reference clock signal to each local oscillator, each local oscillator thereby generating a corresponding local oscillator clock signal; and
supplying a corresponding local oscillator clock signal to a corresponding at least one of a DAC or an ADC.

3. The method of claim 2,
wherein each processing board further includes a jitter cleaner adapted to suppress high frequency phase noise in the external reference clock signal;
wherein the method further comprises the steps of:
suppressing high frequency phase noise in the external reference clock signal using a corresponding jitter cleaner; and
supplying a corresponding suppressed high frequency phase noise local oscillator clock signal to a corresponding at least one of a DAC or an ADC.

4. The method of claim 1, further comprising the steps of:
externally deriving a high-speed sample clock signal from the external reference clock signal; and
supplying the high-speed sample clock signal to the at least one of a DAC or an ADC.

5. The method of claim 1, wherein the step of initializing the PLL includes one or more of readying the PLL to be synchronized to the external reference clock signal, resetting the PLL, setting up one or more clock paths, selecting one or more output types, or enabling one or more outputs.

6. The method of claim 1, further comprises the steps of:
designating a first processing board of the plurality of processing boards as an initiating processing board;
designating a remainder of the plurality of processing boards as target processing boards;
each of the target processing boards tristating their corresponding tristate buffers, each of the target processing boards thereby adapted to receive the board-to-board trigger signal;
each controller issuing a corresponding local trigger command to a corresponding synchronizer, the controller of the initiator processing board issuing the local trigger command after the corresponding controllers of the target processing boards issue corresponding local trigger commands;
each synchronizer registering a corresponding local trigger command to a corresponding local system clock signal;
each acquisition trigger registering a corresponding registered local trigger command to the external synchronization clock signal;
the initiator processing board driving the board-to-board trigger signal to a corresponding board-to-board trigger port of the target processing boards;
capturing the board-to-board trigger signal at a corresponding board-to-board trigger port;
each acquisition trigger registering the board-to-board trigger signal to the external synchronization clock signal; and
wherein each processing board thereby synchronizes a corresponding local system clock tree with each other local system clock tree and the external reference clock signal.

7. The method of claim 1, further comprises the steps of:
each controller driving a corresponding board-to-board trigger port low via a corresponding tristate buffer;
each controller issuing a corresponding local trigger command to a corresponding synchronizer;
each synchronizer registering a corresponding local trigger command to a corresponding local system clock signal;
each acquisition trigger registering a corresponding registered local trigger command to the external synchronization clock signal;
each controller issuing a command to turn off a corresponding tristate buffer, wherein when a last tristate buffer is turned off a board-to-board trigger signal transitions high;
capturing the board-to-board trigger signal at a corresponding board-to-board trigger port;
each acquisition trigger registering the captured board-to-board trigger signal to the external synchronization clock signal; and
wherein each processing board thereby synchronizes a corresponding local system clock tree with each other local system clock tree and the external reference clock signal.

8. The method of claim 1, wherein the external reference clock signal and the external synchronization clock signal are the same clock signal.

9. The method of claim 1, wherein a frequency of the external synchronization clock signal is a greatest common divisor of all clock signal frequencies generated by the local system clock tree.

10. The method of claim 1, wherein after the step of disabling resetting of each VCO feedback divider the method further includes the step of enabling resetting each of the one or more clock dividers via a corresponding command issued by a corresponding controller.

11. A multi-channel system comprising:
a plurality of processing boards, each of the processing boards including:
a processor including:
a controller adapted to issue commands based on instructions;
a system reference generator adapted to generate a synchronization/system reference signal;
a synchronizer adapted to receive an external synchronization clock signal;
an acquisition trigger adapted to generate a converter master trigger signal;
a board-to-board trigger port adapted to transmit or receive a board-to-board trigger signal;
a tristate buffer adapted to control when the board-to-board trigger port transmits or receives the board-to-board trigger signal; and
a phase lock loop (PLL) adapted to receive the synchronization/system reference signal, the PLL including:
a voltage-controlled oscillator (VCO) adapted to receive an external reference clock signal, the external reference clock signal coherent with the external synchronization clock signal, the VCO adapted to output a VCO clock signal;
a VCO feedback divider adapted to divide down the VCO clock signal by a first factor;
a local system clock divider adapted to divide down the VCO clock signal by a second factor, thereby generating a local system clock signal; and
one or more clock dividers, each of the one or more clock dividers adapted to divide down the VCO clock signal by a corresponding factor, thereby generating one or more corresponding divided clock signals;
wherein the VCO, the VCO feedback adapter, the local system clock divider, and the one or more clock dividers form a local system clock tree; and
at least one of a digital-to-analog converter (DAC) or an analog-to-digital converter (ADC), the least one of a DAC or an ADC adapted to receive the converter master trigger signal and initiate conversion;

wherein the processor further includes a memory for storing instructions, the instructions causing the controller to issue commands including:
   an initialization command to the PLL;
   a reset command to the VCO feedback divider and the local system clock divider, thereby causing the VCO clock signal and the local system clock signal to be coherent with the external reference clock signal;
   a disable reset command to the VCO feedback divider and the local system clock divider;
   a synchronization command to the system reference clock generator and the PLL, thereby causing the synchronization/system reference signal, the local system clock signal, and the one or more divided clock signals to be coherent with the external reference clock signal;
   a disable reset command to the local system clock divider and the one or more clock dividers; and
   an enable generation command to the system reference generator to generate the synchronization/system reference signal, the acquisition trigger thereby generating the master trigger signal.

12. The multi-channel system of claim 11,
   wherein the synchronizer includes at least first and second flipflops; and
   wherein the acquisition trigger includes at least third and fourth flipflops.

13. The multi-channel system of claim 11 further comprising a clock source adapted to generate the external reference clock signal and the external synchronization clock signal.

14. The multi-channel system of claim 11,
   wherein each processing board further includes a corresponding local oscillator adapted to receive the external reference clock signal, each local oscillator adapted to thereby generate a corresponding local oscillator clock signal; and
   wherein each of the at least one of a DAC or an ADC is adapted to receive a corresponding local oscillator clock signal.

15. The multi-channel system of claim 14,
   wherein each processing board further includes a jitter cleaner adapted to suppress high frequency phase noise in the external reference clock signal; and
   wherein each of the at least one of a DAC or an ADC is adapted to receive a corresponding suppressed high frequency phase noise local oscillator clock signal.

16. The multi-channel system of claim 11,
   further comprising a high-speed sample clock adapted to receive the external reference clock signal, the high-speed sample clock adapted to generate one or more high-speed sample clock signals therefrom; and
   wherein each of the at least one of a DAC or an ADC is adapted to receive one of the one or more high-speed sample clock signals.

17. The multi-channel system of claim 11, wherein the memory stores further instructions, the further instructions causing the controller to issue commands including:
   a determination command to determine if a corresponding processing board is designated as an initiating processing board or a target processing board;
   when the processing board is designated as a target processing board, a tristating command to a corresponding tristate buffer, the target processing board thereby adapted to receive the board-to-board trigger signal;
   a local trigger generator command to a corresponding synchronizer, the corresponding synchronizer generating a corresponding local trigger command, the controller of the initiator processing board issuing the local trigger command after the corresponding controllers of the target processing boards issue corresponding local trigger commands, each synchronizer adapted to register a corresponding local trigger command to a corresponding local system clock signal, each acquisition trigger registering a corresponding registered local trigger command to the external synchronization clock signal;
   when the processing board is designated as an initiator processing board, a board-to-board trigger command to the board-to-board trigger port, the initiator processing board thereby transmitting the board-to-board trigger signal to the board-to-board trigger ports of the target processing boards, each processing board thereby capturing the board-to-board trigger signal at a corresponding board-to-board trigger port, each acquisition trigger registering the board-to-board trigger signal to the external synchronization clock signal, each processing board thereby synchronizing a corresponding local system clock tree with each other local system clock tree and the external reference clock signal.

18. The multi-channel system of claim 11, wherein the memory stores further instructions, the further instructions causing the controller to issue commands including:
   a board-to-board trigger low command to a corresponding tristate buffer, each processing board thereby adapted to drive a corresponding board-to-board trigger port low;
   a local trigger generator command to a corresponding synchronizer, the corresponding synchronizer generating a corresponding local trigger command, each synchronizer adapted to register a corresponding local trigger command to a corresponding local system clock signal, each acquisition trigger registering a corresponding registered local trigger command to the external synchronization clock signal; and
   a tristate off command to a corresponding tristate buffer, wherein when a last tristate buffer is turned off a board-to-board trigger signal transitions high, each processing board thereby capturing the board-to-board trigger signal at a corresponding board-to-board trigger port, each acquisition trigger registering the board-to-board trigger signal to the external synchronization clock signal, each processing board thereby synchronizing a corresponding local system clock tree with each other local system clock tree and the external reference clock signal.

19. The multi-channel system of claim 11, wherein a frequency of the external synchronization clock signal is a greatest common divisor of all clock signal frequencies generated by the local system clock tree.

* * * * *